United States Patent
Hintz et al.

(10) Patent No.: US 6,622,372 B2
(45) Date of Patent: Sep. 23, 2003

(54) METHOD FOR SETTING ELECTRICAL CHARACTERISTICS OF SENSORS AFTER ASSEMBLY

(75) Inventors: Frederick W. Hintz, Freeport, IL (US); Stephen J. Postma, Pecatonica, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/867,026

(22) Filed: May 29, 2001

(65) Prior Publication Data

US 2001/0023528 A1 Sep. 27, 2001

Related U.S. Application Data

(62) Division of application No. 09/167,108, filed on Oct. 6, 1998, now Pat. No. 6,276,049.

(51) Int. Cl.[7] .............................................. H01C 17/00
(52) U.S. Cl. ........................ 29/610.1; 29/613; 29/619
(58) Field of Search ................................ 29/595, 592.1, 29/610.1, 614, 619, 623

(56) References Cited

U.S. PATENT DOCUMENTS

| | | | | |
|---|---|---|---|---|
| 3,746,853 | A | * 7/1973 | Dittman et al. | 338/25 |
| 4,368,453 | A | * 1/1983 | Herden et al. | 338/25 |
| 4,841,157 | A | * 6/1989 | Downing, Jr. | 250/574 |
| 5,130,556 | A | * 7/1992 | Duncan et al. | 250/560 |
| 5,221,916 | A | * 6/1993 | McQueen | 338/24 |
| 5,365,768 | A | * 11/1994 | Suzuki et al. | 73/1 R |
| 5,801,530 | A | * 9/1998 | Crosby et al. | 324/207.26 |
| 6,314,307 | B1 | * 11/2001 | Charron | 320/152 |

* cited by examiner

*Primary Examiner*—Richard Chang
(74) *Attorney, Agent, or Firm*—Kris T. Fredrick

(57) ABSTRACT

A sensor device is assembled by placing a sensor and a potentiometer within a sensor casing. An electrical connection extending from inside to outside the sensing casing has an interior portion inside the sensor casing and an exterior portion outside the sensor casing. The sensor and the potentiometer are coupled to the interior portion and are sealed within the sensor casing. A potentiometer setting apparatus is coupled to the exterior portion and is used to set the potentiometer. Then, the interior portion of the electrical connection is destroyed so that the potentiometer cannot be subsequently reset.

27 Claims, 3 Drawing Sheets

METHOD FOR SETTING ELECTRICAL CHARACTERISTICS OF SENSORS AFTER ASSEMBLY

This is a divisional of application Ser. No. 09/167,108, filed Oct. 6, 1998, now U.S. Pat. No. 6,276,049.

BACKGROUND OF THE INVENTION

1. Field of the Invention

This invention relates generally to sensors whose sensitivity is set via a potentiometer located within the sensor casing and which is encased in a potting compound.

2. Description of the Prior Art

In the assembly of a typical proximity sensor, the operate point, or sensitivity, of the sensor is set before assembly is completed. This is done because in a typical sensor, such as a proximity sensor, the sensitivity is set manually through direct contact with the potentiometer adjustment screw. The potentiometer and associated electronics, usually contained on a PC board, are then fitted within the casing of the sensor and surrounded with a setting, or potting, compound in a liquid state which then hardens to protect the components from outside environmental influences such as shock, moisture, or the like. However, upon this potting operation, the sensitivity or operate point, of the sensor may shift from the initial set point. If the sensitivity shifts far enough so that the sensor is no longer within specifications the sensor must be scrapped. Also, because of this limitation the design and layout of the components may need to be tailored around setting the sensitivity in the middle of the assembly process. Therefore, the assembly process may require methods such as multiple fillings and automated assembly interruption for manual intervention during assembly. These steps result in more time and expense to assemble the sensor.

Therefore, it would be desirable to have a method of constructing a sensor such that the potentiometer may be potted and then set to yield the proper sensitivity for the sensor thereby yielding a smoother assembly process and less out of tolerance sensors which must be scrapped. It would further be desirable to render the set point to the potentiometer, and thus the sensor sensitivity, stable against all outside influences once the sensor is completely constructed within specifications.

SUMMARY OF THE INVENTION

In order to accomplish the above purposes it is desirable to replace a potentiometer of the direct-contact, manually adjustable type with a remotely adjustable potentiometer, whereby the adjustment means may affect the set point of the potentiometer and thus the sensitivity of the sensor, after the sensor is completely constructed with its electronic components sealed within the case, such as by overmolding, sealing in a potting compound, or encased in a snap-together casing which is not easily separated.

This may be accomplished by substitution of a manually adjustable potentiometer with a digital potentiometer having remote adjustment means. However, because digital potentiometers may be knocked out of adjustment by having their set point affected by environmental transients, the remote adjustment line, once the proper set point has been obtained, is destroyed so that the sensor remains within specified operating parameters.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
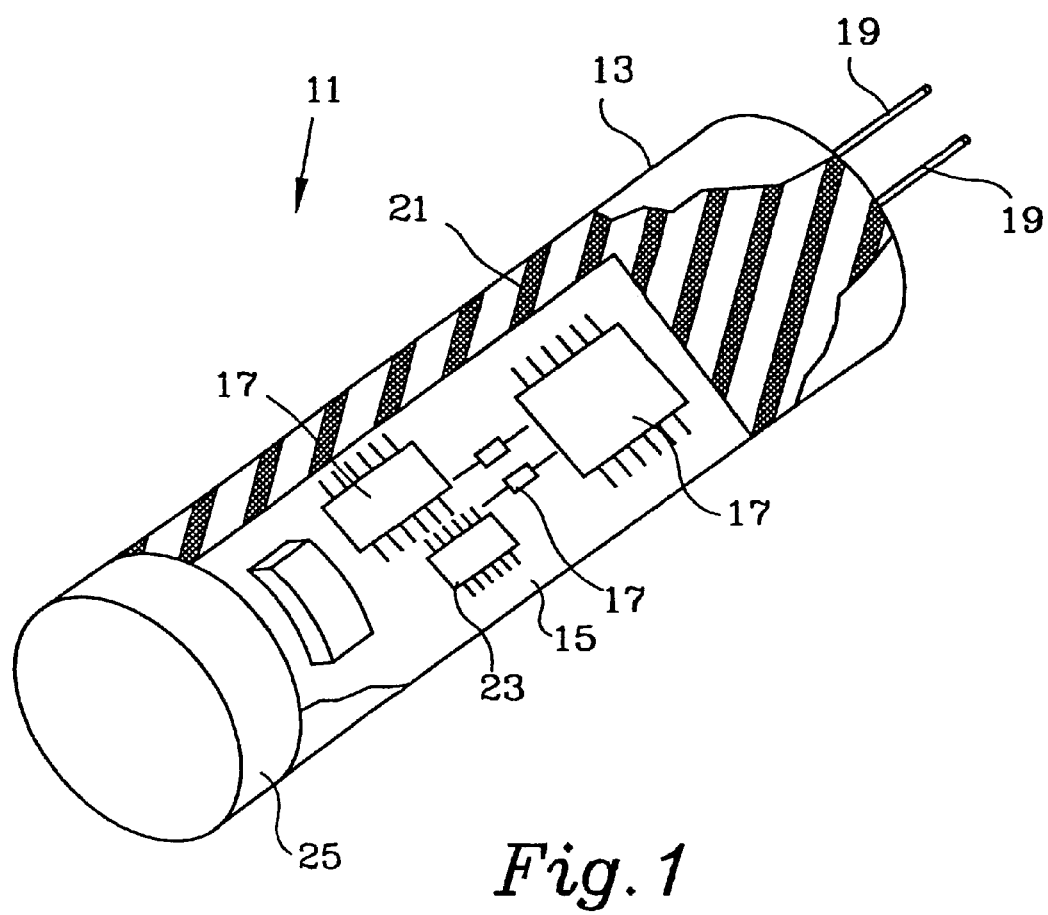
FIG. 1 is a partial cut away view of a proximity sensor according to the present invention generally detailing the environment of the present invention.

Throughout the Description of the Preferred Embodiment, like components will be identified by like reference numerals.

Referencing FIG. 1, a proximity sensor 11 is shown. While the present invention is described in the preferred embodiment with specific reference to this proximity sensor, it will be appreciated by the ordinary artisan that other sensors may likewise benefit from the utilization of the present invention.

The proximity sensor 11 generally comprises a case 13 within which is inserted a PC board 15 to which are affixed electronic components, collectively referenced as 17. The type and amount of electrical components are not considered necessary to an exposition of the present invention beyond that detailed below. The PC board 15 is connected to electrical connectors 19 extending to the exterior of the case 13. The PC board 15 and electrical components 17 thereon are fixed within the casing during assembly, preferably by application of a fluid potting compound 21 which then hardens to prevent environmental damages to the electrical component 17. The hardened compound 21 is schematically indicated by cross hatching in FIG. 1. While the necessary components for operation of the sensing apparatus 11 will be known to the ordinarily skilled artisan, a remotely settable digital potentiometer 23 is shown in FIG. 1 for further understanding of FIGS. 2 and 3.

Preferably, during construction of the sensor 11, the potentiometer 23 will be set to zero before the PC board 15 is inserted in the case 13 so that only the increment function to set the potentiometer need be operated to set the final value of sensor sensitivity. However, the potentiometer could be set to a midpoint and incremented or decremented later as necessary. The potting compound 21, typically an epoxy, will therein be applied and allowed to harden and the case 13 will be thereby sealed. Additionally one or more end caps 25 may be applied as necessary for the finished assembly. At this point an electrical connection to the digital potentiometer 23 will still exist through at least one of the plurality of electrical connectors 19. The sensor 11 is then placed in a suitable test apparatus and the potentiometer 23 is adjusted until the sensitivity of the sensor 11 is within the specification. As detailed below, the electrical connection between the remotely adjustable, or settable, digital potentiometer 23 is then severed so that the potentiometer value can not be changed accidentally or through encountering environmental transients.

Figure 2:
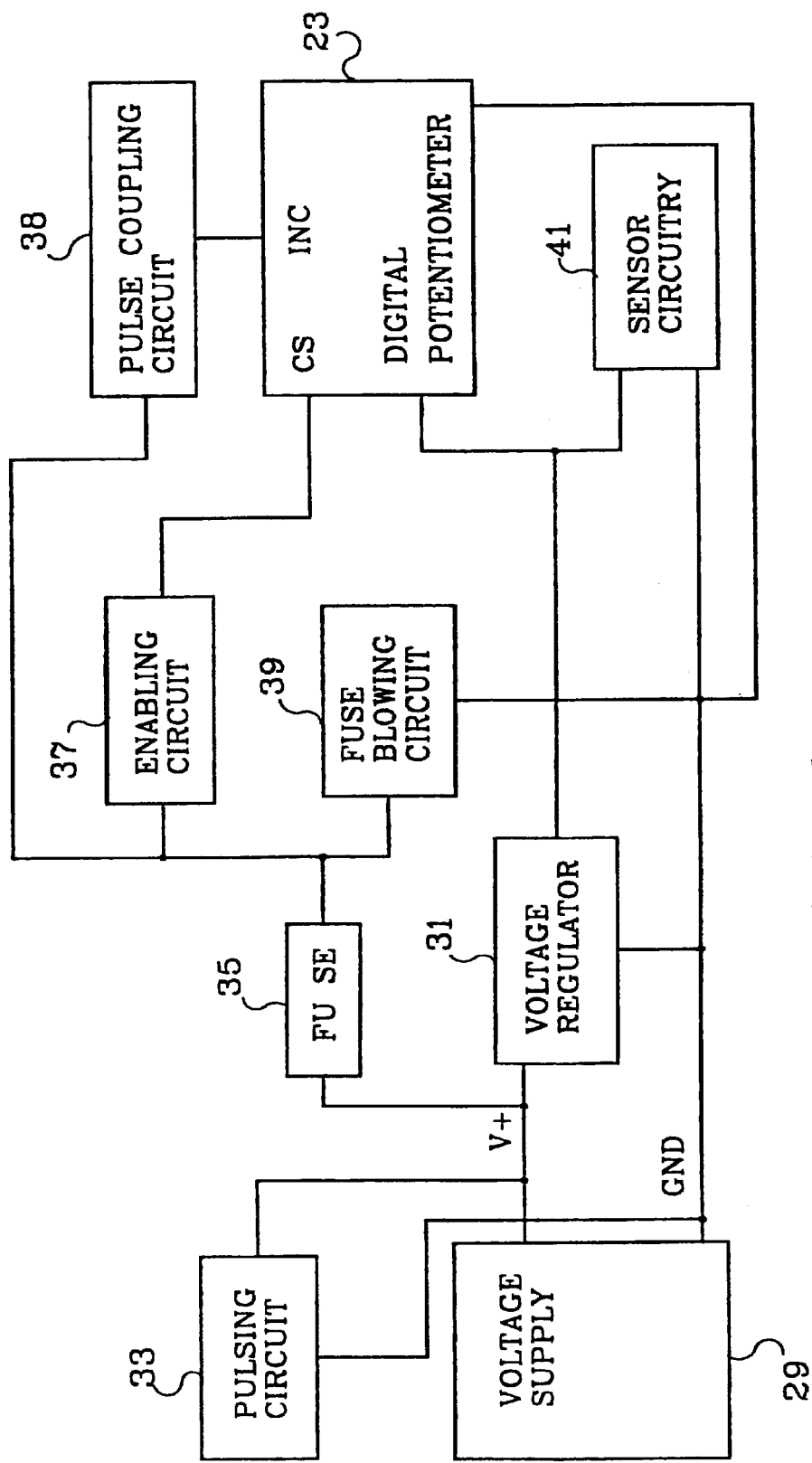
FIG. 2 is a schematic representation of the electrical components of the proximity sensor of FIG. 1.

Referencing FIG. 2, an electrical diagram for operation of the sensor 11 is shown. While the generally referenced electrical components 17 are shown in FIG. 2 as discrete boxes, this is not intended to limit the present invention to any configuration or combination of discrete components. It will be recognized that various functional groupings may be combined into one or more integrated circuits, subassemblies, or the like.

The voltage supply 29 and a pulsing circuit 33 are preferably external to the PCB 15 (FIG. 1) and connected thereto via an electrical connector such as a wire, ribbon connector, or the like extending between the electrical connectors 19 and the PCB. A voltage regulator 31, is connected to a fuse 35 which in turn is connected to an enabling circuit 37 and a pulse coupling circuit 38 both of which are connected to, and for the control of, digital potentiometer 23. The fuse 35 is further connected to a fuse blowing circuit 39 which in turn is connected between the supply voltage and ground to enable an overvoltage condition which will draw enough current to blow the fuse without harming the other sensor components.

The enabling circuit 37, and pulse coupling circuit 38 are connected to those pins necessary to implement the adjustment of the digital potentiometer 23. The digital potentiometer 23 may be of the type such as part number DS1804 available from Dallas Semiconductor Corporation or the like. Once the proximity sensor has been assembled, the potentiometer is remotely set by applying proper voltage pulses to the circuitry through external connectors 19 to adjust the potentiometer as necessary. Once the operating parameters of the proximity sensor are within the desired specification an overvoltage condition is applied to the electrical circuit of FIG. 2 causing the fuse blowing circuit 39 to increase current through the fuse 35 to sufficient to blow, or open, the fuse 35 thereby rendering the set point of the digital potentiometer fixed against accidental pulse application through accidental human intervention or environmental transients.

Figure 3:
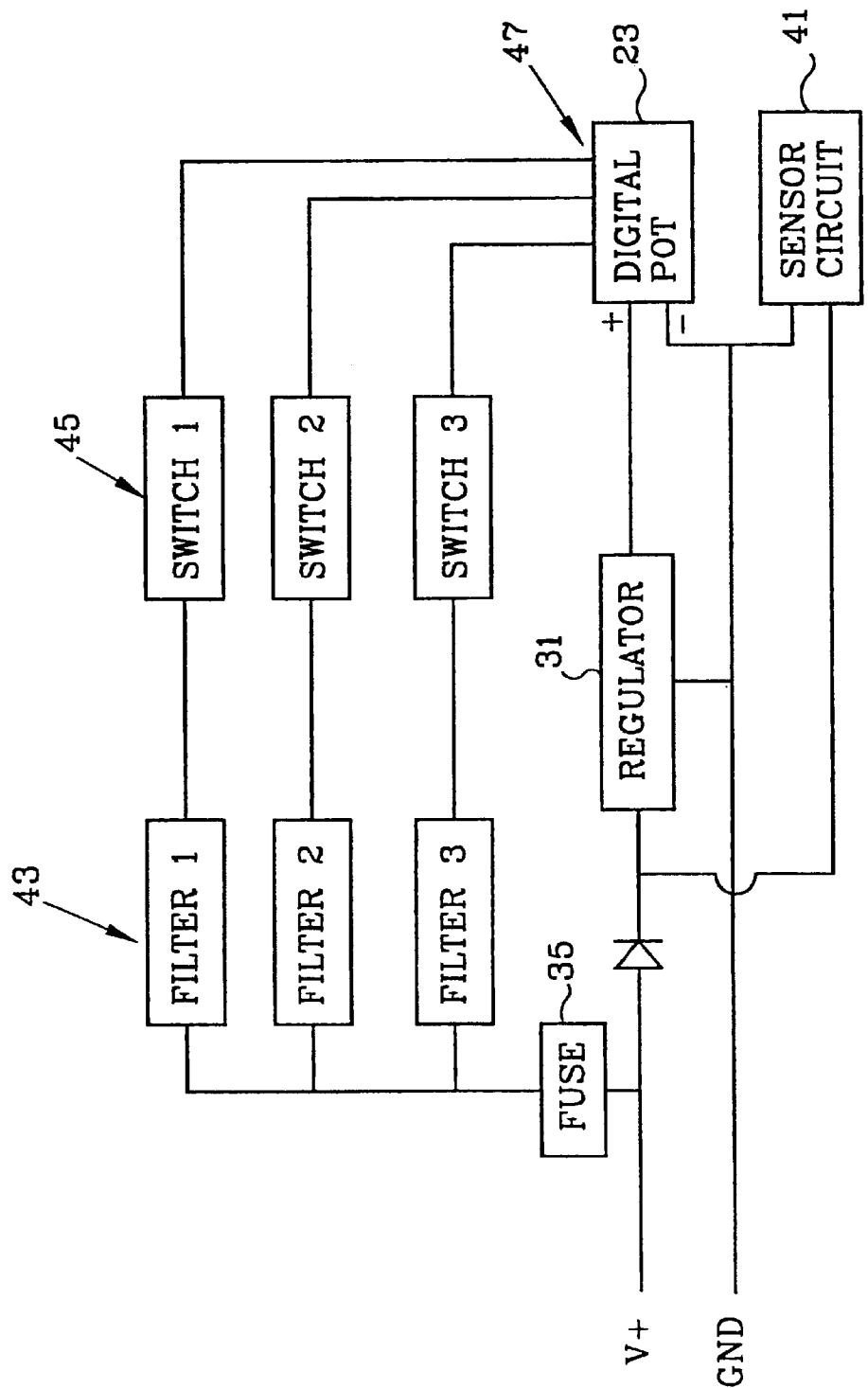
FIG. 3 is an alternative embodiment of the schematic of electrical components from FIG. 2.

As shown in the alternative embodiment of FIG. 3, the circuitry may include a plurality of filters 43 and switches 45 connected between the fuse and the digital potentiometer adjustment pins, indicated generally by 47, to further regulate and control the setting of the potentiometer set point, especially should the remote setting of the potentiometer require a modulated signal or the like. The voltage regulator 31 is indicated in position between the voltage supply 29 and both the digital potentiometer 23 and sensing circuitry 41 in order to control application of the overvoltage condition thereto when opening the fuse 35.

It will thus be appreciated that after setting the potentiometer by remote means, i.e. without resort to the direct manual adjustment of the potentiometer, the fuse 35 will be opened and the sensitivity of the sensor will be locked in to its correct state. Major benefits of this method of sensor construction include the elimination of multiple epoxy fillings steps, eliminating the need for manual intervention during automated assembly and elimination of the need for special interface wires or contacts external to the sensor. While the digital potentiometer shown has been described in terms of having a hard wire electrical connection and pulsed voltage adjustment, it will of course be appreciated that alternative embodiments such as adjustment through a modulated carrier signal or application of pulsed electromagnetic waves such as radio frequencies might also be incorporated into the setting circuitry of the digital potentiometer while retaining the desirable benefits of the present invention.

While the present invention has been described in terms of a specific embodiment, it will of course be appreciated that many variations will occur to a person have ordinary skill in the art and that the present invention may be implemented in a variety of ways and is not to be limited except by the claims herein.

What is claimed is:

1. A method of assembling a sensor comprising:
    placing a sensing apparatus within a sensor casing, wherein the sensing apparatus includes a sensing circuit having an electrical connection extending from inside the sensor casing to outside the sensing casing so that the electrical connection has an interior portion inside the sensor casing and an exterior portion outside the sensor casing, and wherein the sensing apparatus further includes a potentiometer coupled to the interior portion of the electrical connection so that an electrical characteristic of the sensor can be set from outside the sensor casing;
    then setting the potentiometer so that the electrical characteristic has an initial value;
    then sealing the sensing apparatus within the sensor casing;
    measuring the electrical characteristic of the sensor by use of the electrical connection;
    attaching a potentiometer setting apparatus to the exterior portion of the electrical connection;
    then operating the potentiometer setting apparatus to change as necessary the initial value to a final pre-selected value of the electrical characteristic; and
    then destroying the interior portion of the electrical connection.

2. The method of claim 1 wherein the destroying of the interior portion of the electrical connection comprises increasing a signal level sufficiently to destroy the interior portion of the electrical connection.

3. The method of claim 1 wherein the destroying of the interior portion of the electrical connection comprises blowing a fuse coupled to the interior portion of the electrical connection.

4. The method of claim 1 wherein the operating of the potentiometer setting apparatus comprises selecting switches to change as necessary the initial value to the final pre-selected value of the electrical characteristic.

5. The method of claim 1 wherein the operating of the potentiometer setting apparatus comprises selecting filters to change as necessary the initial value to the final pre-selected value of the electrical characteristic.

6. The method of claim 5 wherein the operating of the potentiometer setting apparatus further comprises selecting switches to change as necessary the initial value to the final pre-selected value of the electrical characteristic.

7. A method of assembling a sensor comprising:
    inserting a sensing apparatus within a sensor casing, wherein the sensing apparatus includes a sensing circuit having an electrical connection extending from inside the sensor casing to outside the sensing casing so that the electrical connection has an interior portion inside the sensor casing and an exterior portion outside the sensor casing, and wherein the sensing apparatus further includes a potentiometer coupled to the interior portion of the electrical connection;
    then sealing the sensing apparatus within the sensor casing;
    then attaching a potentiometer setting apparatus to the exterior portion of the electrical connection;
    then offsetting of the potentiometer by use of the potentiometer setting apparatus; and,
    following setting of the potentiometer, destroying the interior portion of the electrical connection so that the potentiometer cannot be subsequently set.

8. The method of claim 7 wherein the destroying of the interior portion of the electrical connection comprises increasing a signal level sufficiently to destroy the interior portion of the electrical connection.

9. The method of claim 7 wherein the destroying of the interior portion of the electrical connection comprises blowing a fuse coupled to the interior portion of the electrical connection.

10. The method of claim 7 wherein the setting of the potentiometer comprises selecting switches to set the potentiometer.

11. The method of claim 7 wherein the setting of the potentiometer comprises selecting filters to set the potentiometer.

12. The method of claim 11 wherein the setting of the potentiometer further comprises selecting switches to set the potentiometer.

13. The method of claim 7 further comprising setting the potentiometer to an initial value before the sealing of the sensing apparatus within the sensor casing, wherein the setting of the potentiometer by use of the potentiometer setting apparatus comprises setting the potentiometer to a final value after the sealing of the sensing apparatus within the sensor casing.

14. The method of claim 13 wherein the initial value comprises substantially zero resistance.

15. The method of claim 13 wherein the potentiometer has a resistance range, wherein the resistance range has a midpoint, and wherein the initial value comprises the midpoint.

16. The method of claim 7 wherein the potentiometer has a resistance, and wherein the setting of the potentiometer comprises increasing the resistance of the potentiometer.

17. The method of claim 7 wherein the potentiometer has a resistance, and wherein the setting of the potentiometer comprises decreasing the resistance of the potentiometer.

18. A method of assembling a sensor device comprising:

inserting a sensor and a potentiometer within a sensor casing, wherein the sensor and potentiometer are coupled to an electrical connection, and wherein the potentiometer is arranged to control a sensitivity of the sensor;

then potting the sensor and the potentiometer within the sensor casing;

then coupling a potentiometer setting apparatus to the potentiometer, wherein the potentiometer setting apparatus is located outside of the sensor casing;

then setting the potentiometer by use of the potentiometer setting apparatus to a resistance that adjusts the sensitivity of the sensor to a predetermined value; and, then preventing subsequent setting of the potentiometer.

19. The method of claim 18 wherein the preventing of subsequent setting of the potentiometer comprises increasing a signal level sufficiently to destroy the electrical connection inside of the sensor casing.

20. The method of claim 18 wherein the preventing of subsequent setting of the potentiometer comprises blowing a fuse in the electrical connection inside of the sensor casing.

21. The method of claim 18 wherein the setting of the potentiometer comprises selecting switches to set the potentiometer.

22. The method of claim 18 wherein the setting of the potentiometer comprises selecting filters to set the potentiometer.

23. The method of claim 22 wherein the setting of the potentiometer comprises selecting switches to set the potentiometer.

24. The method of claim 18 wherein the sensor comprises a proximity sensor.

25. The method of claim 18 wherein the sensor comprises a photoelectric sensor.

26. The method of claim 18 wherein the coupling of a potentiometer setting apparatus comprises magnetically coupling the potentiometer setting apparatus to the potentiometer.

27. The method of claim 18 wherein the coupling of a potentiometer setting apparatus comprises electrically coupling the potentiometer setting apparatus to the potentiometer.

* * * * *